(12) United States Patent
Capewell et al.

(10) Patent No.: US 7,214,598 B2
(45) Date of Patent: May 8, 2007

(54) FORMATION OF LATTICE-TUNING SEMICONDUCTOR SUBSTRATES

(75) Inventors: Adam Daniel Capewell, Leamington Spa (GB); Timothy John Grasby, Worcestershire (GB); Evan Hubert Cresswell Parker, Gloucestershire (GB); Terence Whall, Worcestershire (GB)

(73) Assignee: AdvanceSis Limited, Coventry (GB)

( * ) Notice: Subject to any disclaimer, the term of this patent is extended or adjusted under 35 U.S.C. 154(b) by 76 days.

(21) Appl. No.: 10/514,941

(22) PCT Filed: May 30, 2003

(86) PCT No.: PCT/EP03/50207

§ 371 (c)(1),
(2), (4) Date: Nov. 18, 2004

(87) PCT Pub. No.: WO03/103031

PCT Pub. Date: Dec. 11, 2003

(65) Prior Publication Data

US 2005/0239255 A1    Oct. 27, 2005

(30) Foreign Application Priority Data

May 31, 2002  (GB)  ................................. 0212616.7

(51) Int. Cl.
*H01L 21/20* (2006.01)

(52) U.S. Cl. .................. 438/478; 438/37; 438/479; 438/483; 257/190; 257/191; 257/E21.127

(58) Field of Classification Search ............... 438/37, 438/501
See application file for complete search history.

(56) References Cited

U.S. PATENT DOCUMENTS

| 5,256,550 A | 10/1993 | Laderman et al. |
| 5,442,205 A | 8/1995 | Brasen et al. |
| 5,759,898 A | 6/1998 | Ek et al. |
| 5,891,769 A | 4/1999 | Liaw et al. |
| 6,313,016 B1 | 11/2001 | Kibbel et al. |
| 6,876,010 B1 * | 4/2005 | Fitzgerald .................... 257/191 |
| 2002/0017642 A1 | 2/2002 | Mizushima et al. |

FOREIGN PATENT DOCUMENTS

| EP | 0 514 018 A2 | 4/1992 |
| WO | WO 01/022482 | 3/2001 |
| WO | WO 01/54175 | 7/2001 |

OTHER PUBLICATIONS

Liu et al, "A Surfactant-Mediated Relaxed SI0.5GE0.5 Graded Layer with a Very Low Threading Dislocation Density and Smooth Surface", Applied Physics Letters, American Institute of Physics, vol. 75, No. 11, Sep. 13, 1999, pp. 1586-1588, XP001040754.

* cited by examiner

*Primary Examiner*—Michael Lebentritt
*Assistant Examiner*—Cheung Lee
(74) *Attorney, Agent, or Firm*—Squire, Sanders & Dempsey L.L.P.

(57) ABSTRACT

In order to reduce dislocation pile-ups in a virtual substrate, a buffer layer 32 is provided, between an underlying Si substrate 34 and an uppermost constant composition SiGe layer 36, which comprises alternating graded SiGe layers 38 and uniform SiGe layers 40. During the deposition of each of the graded SiGe layers 38 the Ge fraction x is linearly increased from a value corresponding to the Ge composition ratio of the preceding layer to a value corresponding to the Ge composition ratio of the following layer. Furthermore the Ge fraction x is maintained constant during deposition of each uniform SiGe layer 40, so that the Ge fraction x varies in step-wise fashion through the depth of the buffer layer. After the deposition of each pair of graded and uniform SiGe layers 38 and 40, the wafer is annealed at an elevated temperature greater than the temperature at which the layers have been deposited. Each graded SiGe layer is permitted to relax by pile-ups of dislocations, but the uniform SiGe layers 40 prevent the pile-ups of dislocations from extending out of the graded SiGe layers 38. Furthermore each of the subsequent annealing steps ensures that the previously applied graded and uniform SiGe layers 38 and 40 are fully relaxed in spite of the relative thinness of these layers. As a result the dislocations are produced substantially independently within successive pairs of layers 38 and 40, and are relatively evenly distributed with only small surface undulations 40 being produced. Furthermore the density of threading dislocations is greatly reduced, thus enhancing the performance of the virtual substrate by decreasing the disruption of the atomic lattice which can lead to scattering of electrons in the active devices and degradation of the speed of movement of the electrons.

13 Claims, 2 Drawing Sheets

FORMATION OF LATTICE-TUNING SEMICONDUCTOR SUBSTRATES

This invention relates to the production of lattice-tuning semiconductor substrates, and is more particularly, but not exclusively, concerned with the production of relaxed SiGe (silicon/germanium) "virtual substrates" suitable for the growth of strained silicon or SiGe active layers and unstrained III–V semiconductor active layers within which active semiconductor devices, such as MOSFETs, may be fabricated.

It is known to epitaxially grow a strained Si layer on a Si wafer with a relaxed SiGe buffer layer interposed therebetween, and to fabricate semiconductor devices, such as MOSFETs, within the strained Si layer in order to enhance the properties of the semiconductor devices. The buffer layer is provided in order to increase the lattice spacing relative to the lattice spacing of the underlying Si substrate, and is generally called a virtual substrate.

It is known to epitaxially grow an alloy of silicon and germanium (SiGe) on the silicon substrate to form the buffer layer. Since the lattice spacing of SiGe is greater than the normal lattice spacing of Si, the desired increase in lattice spacing is achieved by the provision of such a buffer layer if the buffer layer is allowed to relax The relaxation of the buffer layer inevitably involves the production of dislocations in the buffer layer to relieve the strain. These dislocations generally form a half loop from the underlying surface which expands to form a long dislocation at the strained interface. However the production of threading dislocations which extend through the depth of the buffer layer is detrimental to the quality of the substrate, in that such dislocations can produce an uneven surface and can cause scattering of electrons within the active semiconductor devices. Furthermore, since many dislocations are required to relieve the strain in a SiGe layer, such dislocations inevitably interact with one another causing pinning of threading dislocations. Additionally more dislocations are required for further relaxation, and this can result in a higher density of threading dislocations.

Known techniques for producing such a buffer layer, such as are disclosed in U.S. Pat. No. 5,442,205, U.S. Pat. No. 5,221,413, WO 98/00857 and JP 6-252046, involve linearly grading the Ge composition in the layer in order that the strained interfaces are distributed over the graded region. This means that the dislocations that form are also distributed over the graded region and are therefore less likely to interact. However such techniques suffer from the fact that the main sources of dislocations are multiplication mechanisms in which many dislocations are generated from the same source, and this causes the dislocations to be clustered in groups, generally on the same atomic glide planes. The strain fields from these groups of dislocations can cause the virtual substrate surface to have large undulations which is both detrimental to the quality of the virtual substrate and has the added effect of trapping threading dislocations.

US 2002/0017642A1 describes a technique in which the buffer layer is formed from a plurality of laminated layers comprising alternating layers of a graded SiGe layer having a Ge composition ratio which gradually increases from the Ge composition ratio of the material on which it is formed to an increased level, and a uniform SiGe layer on top of the graded SiGe layer having a Ge composition ratio at the increased level which is substantially constant across the layer. The provision of such alternating graded and uniform SiGe layers providing stepped variation in the Ge composition ratio across the buffer layer makes it easier for dislocations to propagate in lateral directions at the interfaces, and consequently makes it less likely that threading dislocations will occur, thus tending to provide less surface roughness. However this technique requires the provision of relatively thick, carefully graded alternating layers in order to provide satisfactory performance, and even then can still suffer performance degradation due to the build-up of threading dislocations.

It is an object of the invention to provide a method of forming a lattice-tuning semiconductor substrate in which performance is enhanced by decreasing the density of threading dislocations as compared with known techniques.

According to the present invention there is provided a method of forming a lattice-tuning semiconductor substrate, comprising:

(a) epitaxially growing on a Si wafer surface a first graded SiGe layer having a Ge composition ratio which increases across the layer from a minimum value to a first level;

(b) epitaxially growing on top of the first graded SiGe layer a first uniform SiGe layer having a Ge composition ratio at said first level which is substantially constant across the layer;

(c) annealing at least the first graded SiGe layer at an elevated temperature in order to substantially fully relieve the strain in the SiGe layers; and (d) epitaxially growing on top of the first uniform SiGe layer a second graded SiGe layer having a Ge composition ratio which increases across the layer from said first level to a second level greater than said first level.

Such a technique is capable of producing high quality SiGe virtual substrates with substantially less than $10^6$ dislocations per $cm^2$ by virtue of the fact that the annealing step relaxes at least the lower layers of a series of alternating graded and uniform SiGe layers (the strain to be relieved being as a result of the growth of the graded SiGe layer on an underlying Si layer of different lattice spacing). Such relaxation in turn tends to limit the extent of pile-ups of dislocations on the same atomic planes, and in particular tends to avoid interactions between dislocations and the production of threading dislocations which would otherwise occur as the alternating graded and uniform SiGe layers are built up on top of one another. As a result a thinner virtual substrate can be produced for a given final Ge composition with both the threading dislocation density and the surface undulations being greatly reduced. This results in a virtual substrate which is superior and allows power to be more readily dissipated. The decrease in roughness of the surface of the virtual substrate renders further processing more straightforward in that polishing of the surface can be minimised or dispensed with altogether, and loss of definition due to unevenness of the surface is minimised.

The annealing step, which may be effected either after the growth of the lowermost graded layer or the growth of the lowermost graded and uniform layers, or after the growth of each graded layer or the growth of each pair of graded and uniform layers, is carried out at an elevated temperature which may be in the range of 350 to 1200° C. where each epitaxial growth step is carried out at a temperature in the range of 350 to 1000° C.

The epitaxial growth steps may be effected either by molecular beam epitaxy (MBE) or by chemical vapour deposition (CVD).

In order that the invention may be more fully understood, reference will now be made to the accompanying drawings, in which.

The following description is directed to the formation of a virtual lattice-tuning Si substrate on an underlying Si substrate with the interposition of a SiGe buffer layer. However it should be appreciated that the invention is also applicable to the production of other types of lattice-tuning semiconductor substrates, including substrates terminating at fully relaxed pure Ge allowing III–V incorporation with silicon. It is also possible in accordance with the invention to incorporate one or more surfactants, such as antimony for example, in the epitaxial growth process in order to produce even smoother virtual substrate surfaces and lower density threading dislocations by reducing surface energy.

Figure 1:
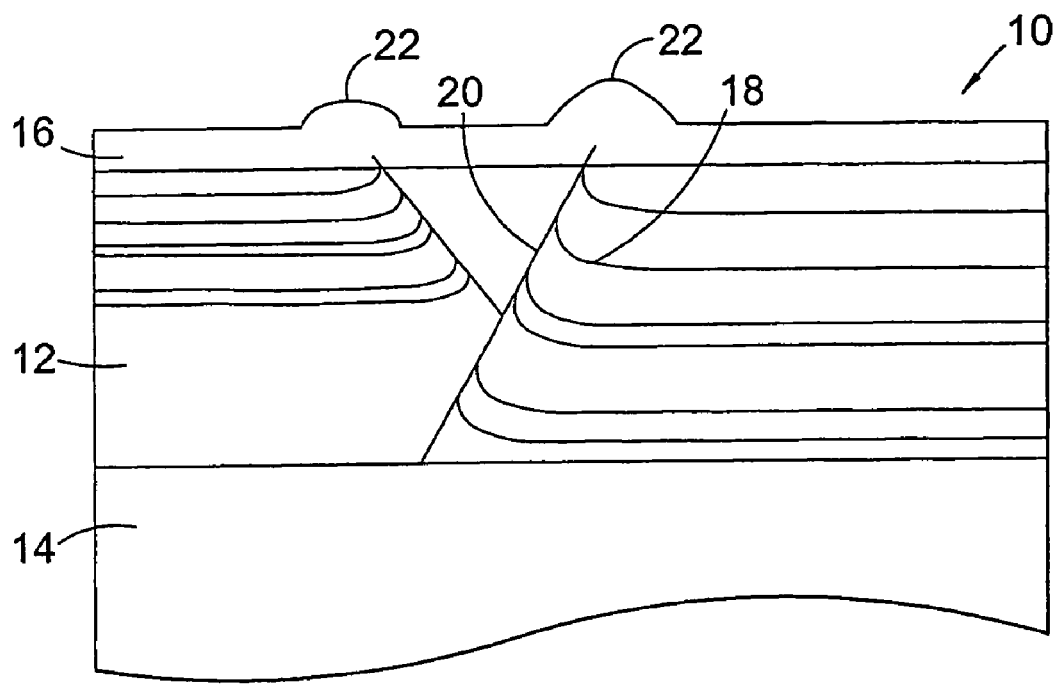
FIG. 1 is an explanatory view showing the effect of the pile-up of dislocations in the buffer layer used in a conventional technique for forming a strained Si substrate.

FIG. 1 shows the structure of a virtual Si substrate 10 produced by a conventional technique in which a graded SiGe buffer layer 12 is interposed between the underlying Si substrate 14 and a constant composition SiGe layer 16. In this case the SiGe buffer layer 12 is epitaxially grown on the surface of the substrate 14, often by chemical vapour deposition (CVD), with the Ge fraction x of the vapour being increased during the deposition process so that the Ge composition ratio is graded linearly across the buffer layer 12 from a value of substantially zero at the interface with the substrate 14 to the required value (for example 50%) at the interface with the constant composition SiGe layer 16. The constant composition SiGe layer 16 provides a surface on which on which a strained Si layer or any other required layer may subsequently be grown for the fabrication of the required semiconductor devices. Such grading of the Ge composition ratio across the full depth of the layer has the result that the dislocations formed during deposition are distributed over the graded region and as a result are less likely to interact with one another than would be the case if the dislocations were formed in a concentrated area.

However, at the low strains involved, there will be a tendency for multiple dislocations to be generated from the same source, with the result that groups of dislocations 18 are produced on a common atomic glide plane 20, and the strain fields from such groups of dislocations can produce threading dislocations extending the full depth of the buffer layer 12 and a large surface undulation 22.

Figure 3:
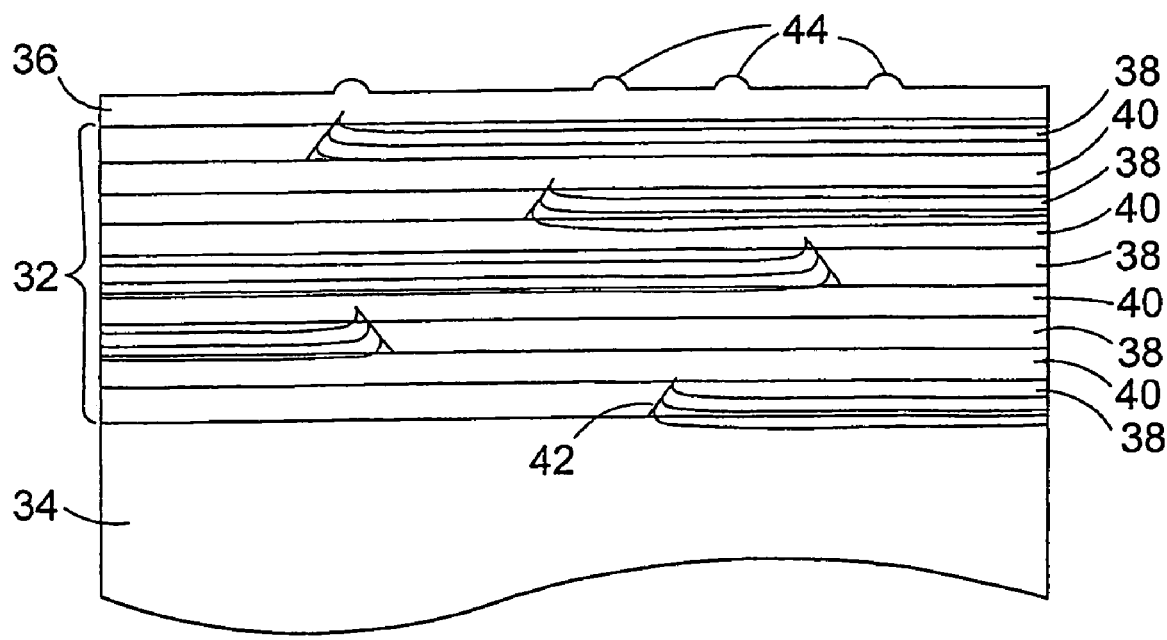
FIG. 3 is an explanatory diagram showing the production of dislocations in the method of FIG. 2.
Figure 2:
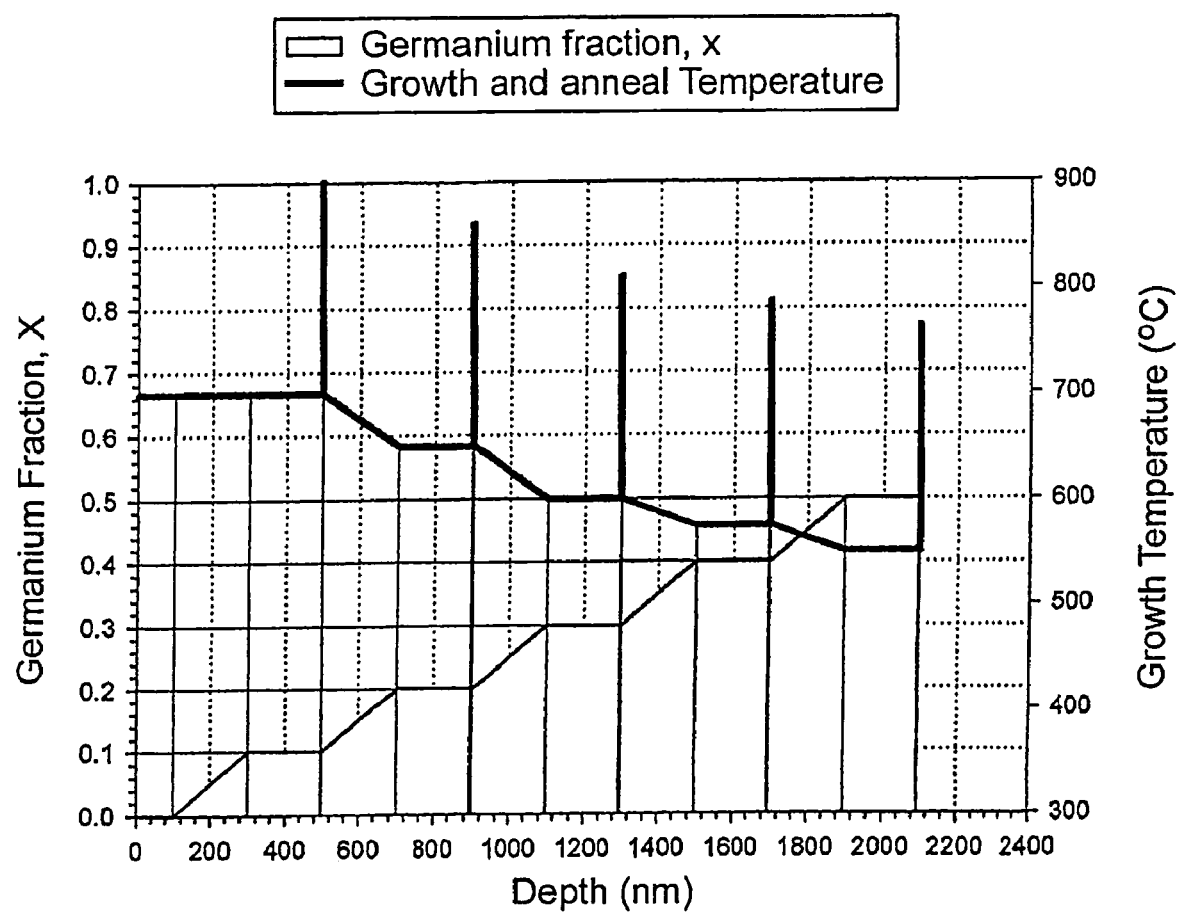
FIG. 2 is a graph showing the variation of the Ge fraction across alternating graded and uniform SiGe layers provided in a method according to the invention, together with typical growth and anneal temperatures used in such a method.

In order to reduce the extent of the dislocation pile-ups, provided by the technique described above, a method in accordance with the invention provides a buffer layer 32, between the Si substrate 34 and a constant composition SiGe layer 36, which comprises alternating graded SiGe layers 38 and uniform SiGe layers 40, as shown in FIG. 3. During the deposition of each of the graded SiGe layers 38 the Ge fraction x is linearly increased from a value corresponding to the Ge composition ratio of the preceding layer to a value corresponding to the Ge composition ratio of the following layer. Furthermore the Ge fraction x is maintained constant during deposition of each uniform SiGe layer 40, so that the Ge fraction x varies in step-wise fashion through the depth of the buffer layer, as shown graphically in FIG. 2.

After the deposition of each pail of graded and uniform SiGe layers 38 and 40, the supply of Si and Ge is stopped, and the wafer is annealed at an elevated temperature greater than the temperature at which the layers have been deposited. This is shown by the upper part of the graph in FIG. 2 and the right-hand scale indicating the growth and annealing temperatures used in the method. It is seen from this that the initial graded and uniform SiGe layers are deposited at a temperature of 700° C., and the subsequent annealing step is carried out at a temperature of 900° C. Subsequent graded and uniform SiGe layers are deposited at successively lower temperatures, and are followed by successively lower temperature annealing steps.

In this technique each graded SiGe layer is permitted to relax by pile-ups of dislocations as shown at 42 in FIG. 3, but the uniform SiGe layers 40 prevent the pile-ups of dislocations from extending out of the graded SiGe layers 38. Furthermore each of the subsequent annealing steps performed in situ ensures that the previously applied graded and uniform SiGe layers 38 and 40 are fully relaxed in spite of the relative thinness of these layers. Thus, after each annealing step, the growth of the subsequent graded and uniform SiGe layers 38 and 40 can proceed substantially independently of the dislocation multiplication mechanisms of the previous layers. As a result the dislocations are produced substantially independently within successive pairs of layers 38 and 40, and the dislocations are relatively evenly distributed with only small surface undulations 40 being produced as a result of such dislocations. Furthermore the density of threading dislocations is greatly reduced, thus enhancing the performance of the virtual substrate by decreasing the disruption of the atomic lattice which can lead to scattering of electrons in the active devices and degradation of the speed of movement of the electrons.

It should be noted that the superior performance of the virtual substrate produced by the above-described technique in accordance with the invention is obtained using relatively thin graded and uniform SiGe layers, typically of the order of 200 nm thickness. The growth temperature and anneal temperature are reduced with increasing Ge composition ratio so as to maintain 2D growth and reduce surface roughening.

EXAMPLE

For the purposes of illustration only, an example of a method in accordance with the invention will now be described in detail. It will be appreciated that the invention is not limited to the particular combination of parameters given.

For the production of a virtual SiGe substrate having a 50% Ge fraction on a (001) orientated 4 inch (approximately 10 centimetres) Si substrate a VG Semicon V90 Solid Source Molecular Beam Epitaxy System (SS-MBE) was used, the growth rates with such a system being typically 0.5–1.0 Å per second (although growth rates of 0.1–10 Å per second are possible). The substrate was first cleaned in a modified RCA etch followed by a 2% hydrofluoride dip and an in situ desorb at 890° C. for 20 minutes. A 100 nm layer of Si was then epitaxially grown on the substrate whilst the growth temperature was reduced from 860° C. to 700° C. utilising a Si source, with the addition of a Ge source having a composition ratio which was increased linearly from 0% to 10% during growth of a 200 nm layer of graded SiGe. With the Ge composition ratio being kept constant at 10% a 200 nm uniform SiGe layer was grown on top of the graded SiGe layer. Growth of the SiGe was then interrupted by closing off the sources and the substrate temperature was raised to 910° C. for 30 minutes to effect annealing of the layers.

After this annealing step the temperature was reduced to 700° C. and epitaxial growth was recommenced with the SiGe sources to produce a 200 nm linearly graded SiGe layer having a Ge composition ratio varying from 10% to 20% over its thickness whilst the temperature was reduced linearly from 700° C. to 650° C. Subsequently a further uniform SiGe layer of 200 nm thickness having a 20% Ge composition ratio was grown at a constant temperature of 650° C. The growth was again interrupted and a further annealing step performed at a temperature of 860° C. for 30 minutes.

The sequence of linearly grading the Ge in a graded SiGe layer whilst simultaneously reducing the temperature, and then providing a uniform SiGe layer at constant temperature, followed by an in situ annealing step for 30 minutes, was repeated until a Ge composition ratio of 50% was reached. The following table summarises the steps of the complete method which is also shown graphically in FIG. 2. It will be appreciated that the method comprises the deposition of five separate graded SiGe layers and five separate uniform SiGe layers, followed by five separate annealing steps to produce a 50% virtual SiGe substrate.

Detailed Growth Specifications

The equipment used for growth is a VG Semicon V90S Solid source—Molecular Beam Epitaxy system (SS-MBE). Growth rates in this system are typically 0.5–1.0 Angstroms per second, although 0.1–10 Angstroms are possible.

A (001) orientated 4" silicon substrate was first cleaned in a modified RCA etch followed by a 2% HF dip and an in-situ desorb at 890° C. for 20 minutes (this is a fairly typical cleaning procedure for silicon wafers). The temperature was reduced whilst growing 100 nm of Si so that the growth of the virtual substrate could commence without interruption. Once the temperature reached 700° C. the germanium fraction was increased linearly to 10% over 200 nm. Then a 200 nm layer of constant composition 10% was grown. Growth of the SiGe was then interrupted as the substrate temperature was raised to 910° C. for 30 minutes. After this anneal the temperature was reduced back to the growth temperature of 700° C. Growth was then reconmmenced and a linearly graded composition from 10% to 20% over 200 nm was grown whilst the temperature was reduced linearly from 700° C. to 650° C. The next layer was grown at 20% Ge over 200 nm with a constant growth temperature of 650° C. Again growth was interrupted and the temperature increased for a 30 minute anneal at 860° C. This sequence of linearly grading the Ge whilst simultaneously reducing the temperature then a constant composition layer at constant temperature followed by an in-situ anneal for 30 minutes was repeated up to 50% Ge. These specifications are summarised in the table and figure below.

| Step | Growth Temperature (° C.) | Germanium Composition (%) | Thickness (nm) | Anneal Temperature (° C.) | Anneal Time (min) |
|---|---|---|---|---|---|
| 1 | 700 | 0–10 | 200 | — | — |
| 2 | 700 | 10 | 200 | — | — |
| 3 | — | — | — | 910 | 30 |
| 4 | 700–650 | 10–20 | 200 | — | — |
| 5 | 650 | 20 | 200 | — | — |
| 6 | — | — | — | 860 | 30 |
| 7 | 650–600 | 20–30 | 200 | — | — |
| 8 | 600 | 30 | 200 | — | — |

-continued

| Step | Growth Temperature (° C.) | Germanium Composition (%) | Thickness (nm) | Anneal Temperature (° C.) | Anneal Time (min) |
|---|---|---|---|---|---|
| 9 | — | — | — | 810 | 30 |
| 10 | 600–575 | 30–40 | 200 | — | — |
| 11 | 575 | 40 | 200 | — | — |
| 12 | — | — | — | 785 | 30 |
| 13 | 575–550 | 40–50 | 200 | — | — |
| 14 | 550 | 50 | 200 | — | — |
| 15 | — | — | — | 760 | 30 |

In the above described example each of the graded and uniform SiGe layers has a thickness of only about 200 nm giving a total thickness of the buffer layer of only about 2 μm. This is advantageous both because thinner layers are more economical to produce, and more importantly because this optimises the thermal coupling between the device layer grown on top of the virtual substrate and the underlying Si substrate given that SiGe is not such a good thermal conductor as Si. The provision of a relatively thin virtual substrate is also advantageous in that, where the virtual substrate covers only selected part of the chip, only a relatively small step is provided between the area incorporating the virtual substrate and other areas of the chip which renders further processing, such as the application of metallisation, more straightforward. This represents a significant improvement over existing virtual substrates.

It should be appreciated that a number of variations in the above described method are possible within the scope of the invention. For example, the thicknesses of the SiGe layers may be varied so that the layers are thinner the further they are from the underlying Si substrate, preferably by providing that each pair of graded and uniform layers is thinner than the preceding pair of layers. Also the thicknesses of all or some of the layers may be greater or less than 200 nm, for example in the range of 50–1000 nm, and preferably in the range of 150–250 nm. The number of graded and uniform SiGe layers may be varied, for example in the range of 4 to 15 pairs of layers, and the grading within the layers may also be over the entire Ge composition range. The composition of the uniform and graded layers may also be varied, for example by including one or more surfactants, such an antimony or atomic hydrogen in order to lower the surface roughness, and/or by varying the composition ratio of Ge in the graded layers in a manner other than linearly provided that the required initial and final composition ratios are provided. Furthermore a thin layer containing a high density of point defects may be grown immediately prior to the growth of some or all of the graded layers in order to promote relaxation. Such a layer may be produced either by epitaxial growth at low temperature, for example at 100 to 400° C., or by ion implantation prior to growth of the graded layer.

A different epitaxial growth process may also be used, such as a gas source MBE process or any variation of the CVD process (for example low pressure, plasma enhanced CVD, atmospheric pressure CVD and ultra high pressure CVD). If low pressure CVD is used, it is may be preferable to maintain the hydrogen atmosphere during each annealing step. It is also possible to limit the number of annealing steps provided in the method, for example in order to provide only one annealing step after growth of the first graded and uniform SiGe layers or two or more annealing steps after growth of only the lower SiGe layers. Such annealing steps help to nucleate dislocations in the lower layers in which more interactions between dislocations tend to occur, and may not be necessary in the upper layers. Where a number of annealing steps are provided, the annealing time may be decreased in subsequent steps as compared with the preceding annealing step. Furthermore the virtual substrate may be epitaxially grown on a patterned silicon wafer or a wafer having a patterned oxide layer such that growth only occurs in selected areas. Thus the fabrication technique may be used to produce a virtual substrate in only one or more selected areas of the chip (as may be required for system-on-a-chip integration) in which enhanced circuit functionality is required, for example.

The method of the invention is capable of a wide range of applications, including the provision of a virtual substrate for the growth of strained or relaxed Si, Ge or SiGe layers for fabrication of devices such as bipolar junction transistors (BJT), field effect transistors (FET) and resonance tunnelling diodes (RTD), as well as III–V semiconductor layers for high speed digital interface to CMOS technologies and optoelectronic applications including light emitting diodes (LEDs) and semiconductor lasers.

The invention claimed is:

1. A method of forming a lattice-tuning semiconductor substrate, comprising:
   (a) epitaxially growing on a Si surface a first graded SiGe layer having a Ge composition ratio which increases across the layer from a minimum value to a first level;
   (b) epitaxially growing on top of the first graded SiGe layer a first uniform SiGe layer having a Ge composition ratio at said first level which is substantially constant across the layer;
   (c) annealing at least the first graded SiGe layer at an elevated temperature in order to substantially fully relieve the strain in the SiGe layers; and
   (d) after annealing step (c), epitaxially growing on top of the first uniform SiGe layer a second graded SiGe layer having a Ge composition ratio which increases across the layer from said first level to a second level greater than said first level.

2. A method according to claim 1, further comprising epitaxially growing on top of the second graded SiGe layer a second uniform SiGe layer having a Ge composition ratio at said second level which is substantially constant across the layer.

3. A method according to claim 2, wherein further graded and uniform SiGe layers are epitaxially grown on top of the first and second SiGe layers with the SiGe composition ratio increasing across the or each graded SiGe layer from the level of the preceding uniform SiGe layer to an increased level.

4. A method according to claim 2, wherein the epitaxial growth of at least one of the second and further uniform SiGe layers is followed by a further annealing step at an elevated temperature similar to the annealing step (c).

5. A method according to claim 3, wherein each epitaxial growth step is carried out at a temperature in the range of 350 to 1000° C.

6. A method according to claim 1, wherein the or each annealing step is carried out at an elevated temperature in the range of 500 to 1200° C.

7. A method according to claim 1, wherein the epitaxial growth steps are effected by molecular beam epitaxy (MBE).

8. A method according to claim 1, wherein the epitaxial growth steps are effected by chemical vapour deposition (CVD).

9. A method according to claim 1, wherein the surface roughness of at least some of the graded and uniform SiGe layers is lowered by the addition of one or more surfactants.

10. A method according to claim 1, wherein a thin layer containing a high density of point defects is grown immediately prior to the growth of at least one of the graded SiGe layers.

11. A method according to claim 1, further comprising the step of growing on top of the graded and uniform SiGe layers a strained Si layer within which one or more semiconductor devices are formed.

12. A lattice-tuning semiconductor substrate formed by a method according to claim 1.

13. A lattice-tuning semiconductor substrate according to claim 12, incorporating a strained Si layer within which one or more semiconductor devices are formed.

* * * * *